United States Patent
Choi

(10) Patent No.: US 8,982,621 B2
(45) Date of Patent: Mar. 17, 2015

(54) 3-DIMENSIONAL NON-VOLATILE MEMORY DEVICE AND METHOD OF MANUFACTURING THE SAME

(75) Inventor: Eun Seok Choi, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 373 days.

(21) Appl. No.: 13/477,479

(22) Filed: May 22, 2012

(65) Prior Publication Data

US 2012/0300547 A1 Nov. 29, 2012

(30) Foreign Application Priority Data

May 24, 2011 (KR) ........................ 10-2011-0049020

(51) Int. Cl.
| | |
|---|---|
| G11C 11/34 | (2006.01) |
| H01L 27/115 | (2006.01) |
| H01L 29/792 | (2006.01) |
| G11C 16/04 | (2006.01) |

(52) U.S. Cl.
CPC .... *H01L 27/11565* (2013.01); *H01L 27/11582* (2013.01); *H01L 29/7926* (2013.01); *G11C 16/0483* (2013.01); H01L 27/11568 (2013.01)
USPC ............. 365/185.05; 365/185.11; 365/230.03

(58) Field of Classification Search
CPC ............................... H01L 27/115; G11C 16/10
USPC ............................ 365/185.05, 230.03, 185.11
See application file for complete search history.

(56) References Cited

U.S. PATENT DOCUMENTS 7,796,439 B2 * 9/2010 Arai et al. ................ 365/185.22

FOREIGN PATENT DOCUMENTS

| KR | 1020080060622 | 7/2008 |
|---|---|---|
| KR | 1020100081943 | 7/2010 |

OTHER PUBLICATIONS

Preliminary Rejection issued by the Korean Intellectual Property Office on Dec. 24, 2012.
Katsumata, R., et al., Pipe-shaped BiCS Flash Memory with 16 Stacked Layers and Multi-Level-Cell Operation for Ultra High Density Storage Devices, 2009 Symposium on VLSI Technology Digest of Technical Papers, pp. 136-137.

* cited by examiner

*Primary Examiner* — Son Dinh
(74) *Attorney, Agent, or Firm* — IP & T Group LLP

(57) ABSTRACT

A non-volatile memory device comprising a plurality of strings each including a drain select transistor, drain-side memory cells, a pipe transistor, source-side memory cells, and a source select transistor coupled in series, wherein the plurality of strings are arranged in a first direction and a second direction, and the strings arranged in the second direction form each of string columns; a plurality of bit lines extended in the second direction and coupled to the drain select transistors of the strings included in each string column; and a plurality of source lines extended in the first direction and in common coupled to the source select transistors of strings adjacent to each other in the second direction, wherein strings included in one of the string columns are staggered in the first direction and each of the string columns are coupled to at least two of the bit lines.

10 Claims, 18 Drawing Sheets

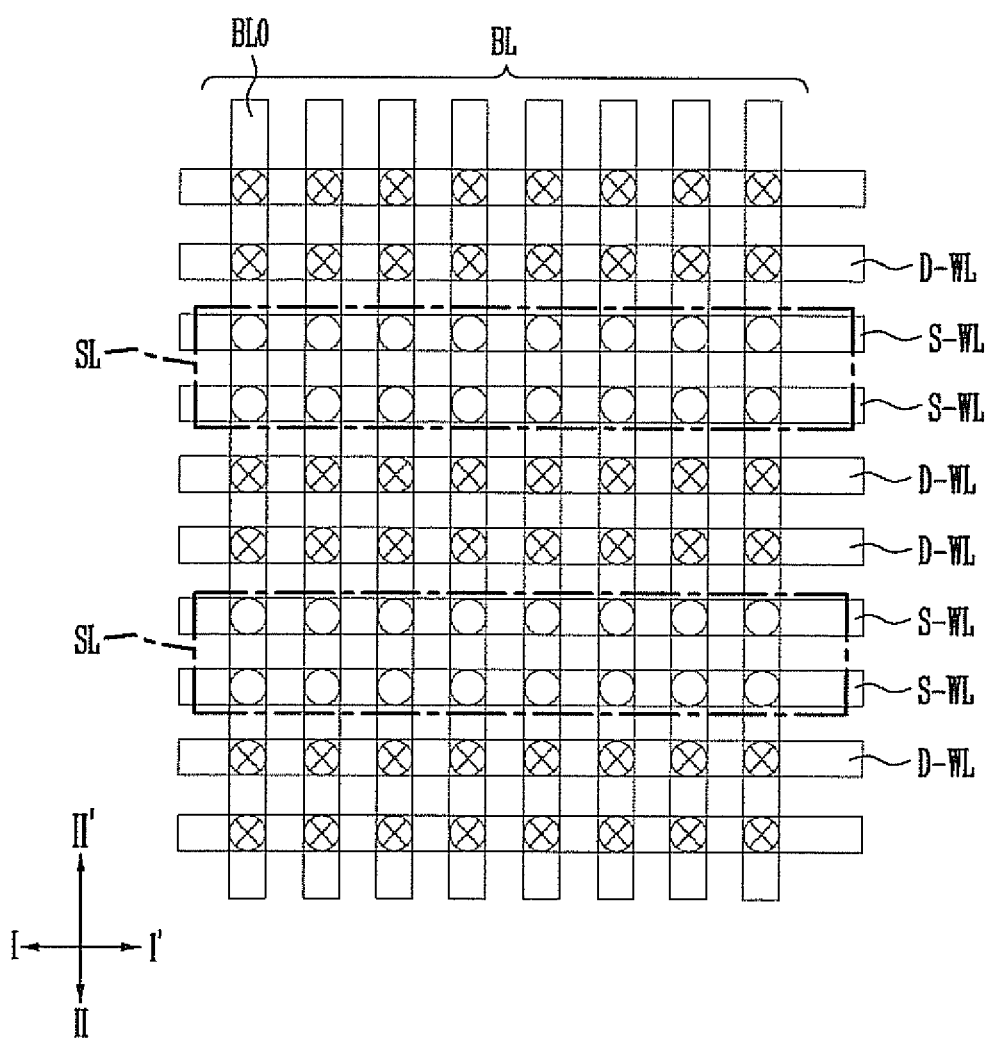

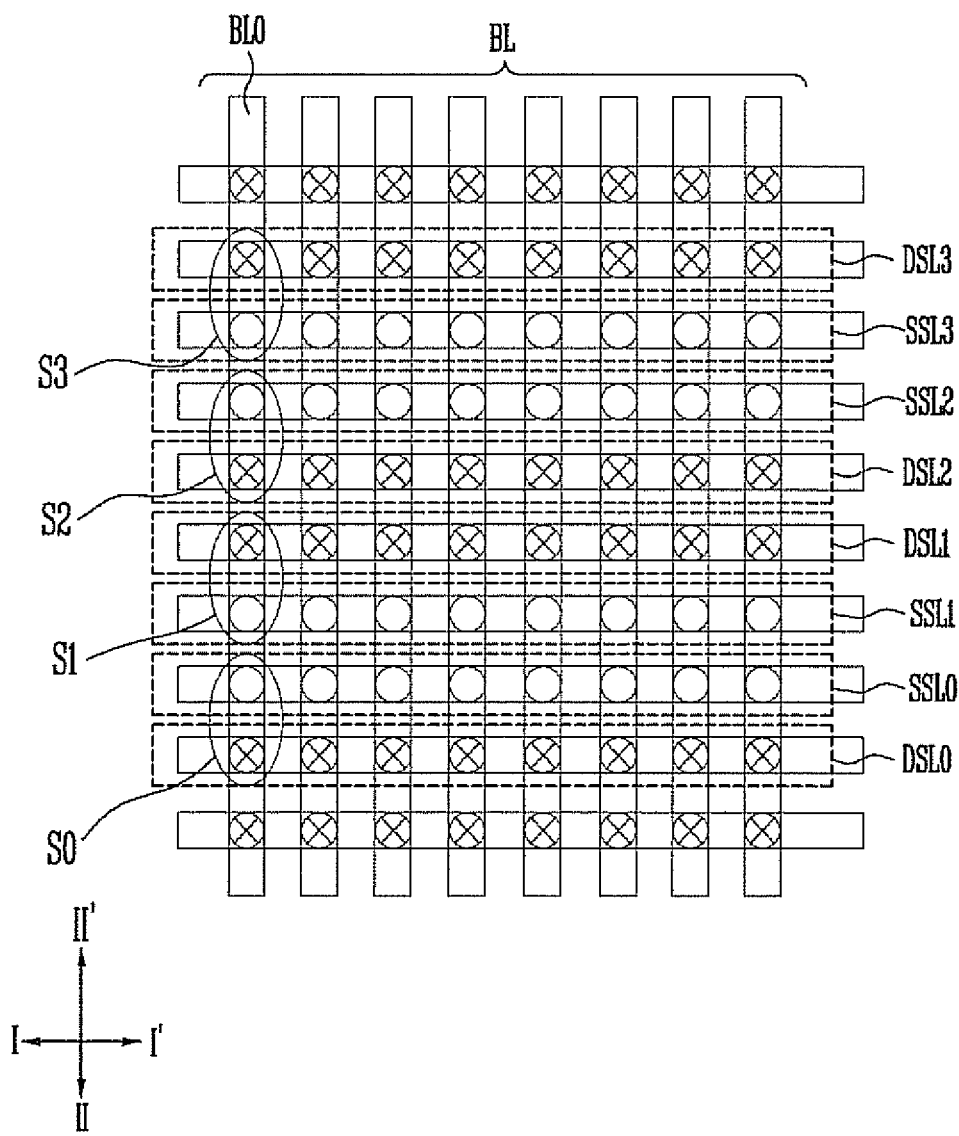

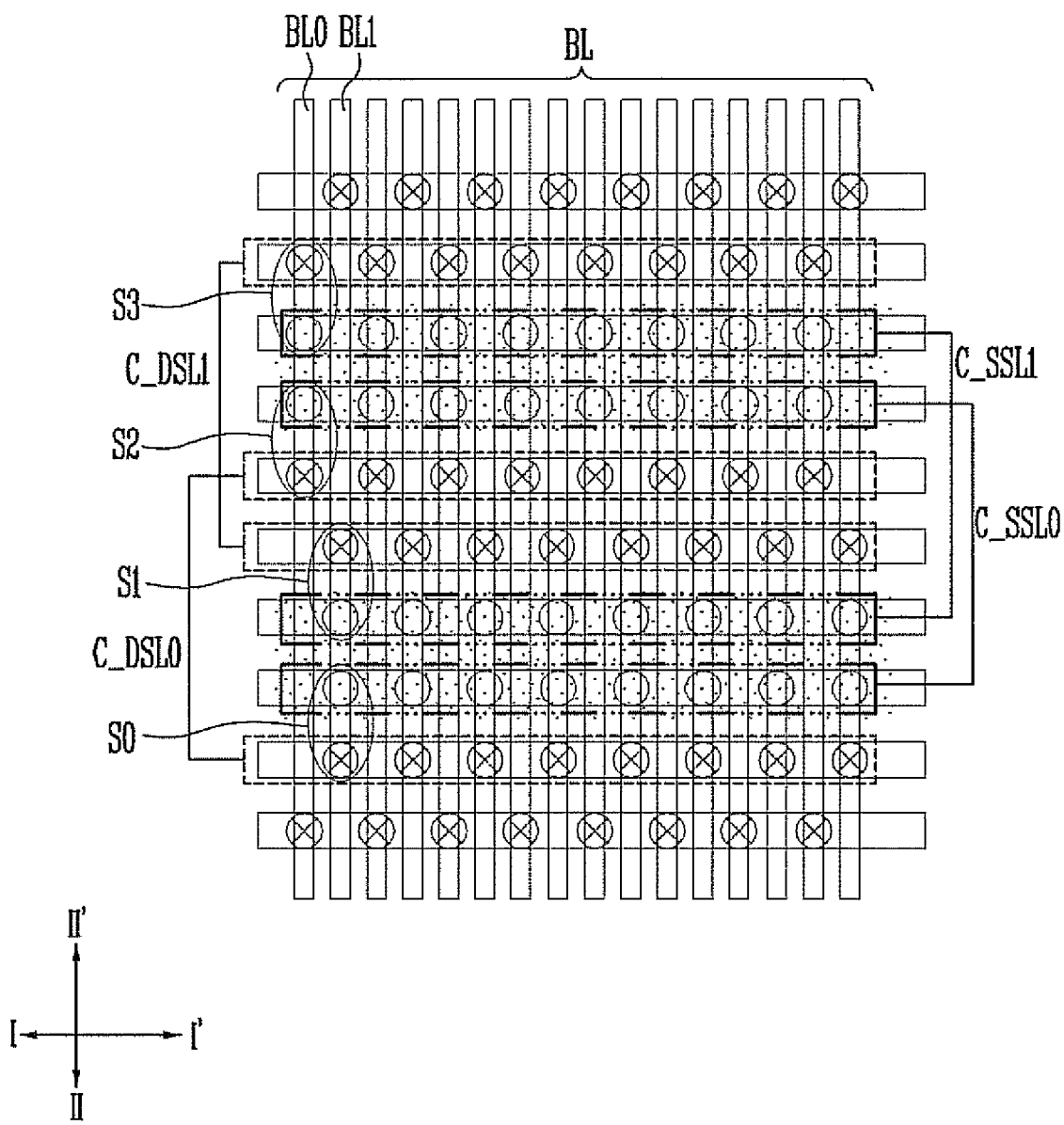

ated on May 24, 2011, the entire disclosure of which
3-DIMENSIONAL NON-VOLATILE MEMORY DEVICE AND METHOD OF MANUFACTURING THE SAME

CROSS-REFERENCE TO RELATED APPLICATION

Priority to Korean patent application number 10-2011-0049020 filed on May 24, 2011, the entire disclosure of which is incorporated by reference herein, is claimed.

BACKGROUND

Exemplary embodiments relate to a semiconductor device and a method of manufacturing the same and, more particularly, to a non-volatile memory device having a three-dimensional (3-D) structure and a method of manufacturing the same.

Nonvolatile memory devices retain stored data even when power is interrupted. Two-dimensional (2D) memory devices fabricated in a single layer on a silicon substrate have limitations in improving integration density. Therefore, 3D non-volatile memory devices with memory cells stacked vertically from a silicon substrate have been proposed.

The structure of a conventional non-volatile memory device having a 3-D structure and features thereof are described below with reference to relevant drawings.

FIGS. 1A and 1B are layout diagrams of a conventional U-shaped channel type non-volatile memory device.

As shown, the conventional U-shaped channel type non-volatile memory device includes a plurality of drain-side word lines D_WL and a plurality of source-side word lines S_WL, which are extended in parallel in a first direction I-I'. The plurality of drain-side word lines D_WL and the plurality of source-side word lines S_WL are alternately arranged.

The plurality of drain-side word lines D_WL and the plurality of source-side word lines S_WL are arranged in a stack form. A plurality of the drain-side word lines D_WL formed in the same level are interconnected, and a plurality of the source-side word lines S_WL formed in the same level are also interconnected.

The non-volatile memory device further includes a plurality of source lines SL extended in parallel in the first direction I-I' on the source-side word lines S_WL.

The non-volatile memory device further includes a plurality of strings S0 to S3 arranged in the first direction I-I' and a second direction II-II' and a plurality of bit lines BL arranged in parallel in the second direction II-II'. The strings S0 to S3 arranged in the second direction II-II' are coupled to the same bit line BL. In the drawings, drain contact plugs are indicated by symbols ⓧ, and source contact plugs are indicated by symbols ○.

FIG. 2 is a perspective view illustrating the structure of the conventional non-volatile memory device having a 3-D structure. Interlayer dielectric layers are not shown in FIG. 2, for illustration purposes.

As shown, the conventional U-shaped channel type non-volatile memory device includes a plurality of U-shaped channels CH arranged in a first direction I-I' and a second direction II-II' crossing the first direction I-I'. Each of the U-shaped channels CH includes a first channel CH1 and a pair of second channels CH2 coupled to the first channel CH1.

The non-volatile memory device further includes a plurality of memory cells MC stacked along the U-shaped channel CH. A drain select transistor DST and a source select transistor SST are provided at both ends of the U-shaped channel CH. A plurality of the memory cells MC arranged between the drain select transistor DST and the source select transistor SST form one string S1 or S0. The non-volatile memory device further includes a bit line BL0 coupled to the channel of the drain select transistor DST and a source line SL coupled to the channel of the source select transistor SST.

Each of the memory cells MC includes the second channel CH2, a tunnel insulating layer (not shown), a charge trap layer (not shown), and a charge blocking layer (not shown) surrounding the second channel CH2, and a word line WL. The drain select transistor DST includes the second channel CH2, a gate insulating layer (not shown) surrounding the second channel CH2, and a drain select line DSL0 or DSL1. The source select transistor SST includes the second channel CH2, a gate insulating layer (not shown) surrounding the second channel CH2, and a source select line SSL.

FIG. 3A is a circuit diagram illustrating part of the cell array of the conventional non-volatile memory device having a 3-D structure. The cell array of FIG. 3A illustrates the cell array of strings S0 to S3 included in one of the string columns and coupled to the bit line BL0 of FIGS. 1A and 1B.

As shown, the strings S0 to S3 are coupled to the same bit line BL0. The strings S0 to S3 include respective drain select lines DSL0 to DSL3 and respective source select lines SSL0 to SSL3 that drive the strings S0 to S3.

In this structure, memory cells formed in the same level and formed to share a source-side word line or a drain-side word line must be driven as different pages because they are coupled to the same bit line BL0. For example, when the source-side word lines WL14 are driven, the memory cells are driven as four pages page_n to page_n+3, respectively, by controlling the drain select lines DSL0 to DSL3 and the source select lines SSL0 to SSL3.

FIG. 3B is a diagram illustrating the page numbers of the conventional non-volatile memory device having a 3-D structure. The page numbers of FIG. 3B show the page numbers of the cell array shown in FIG. 3A.

For example, in a device that includes 32 memory cells in one string that are driven as Multi-Level Cells (MLCs), memory cells included in four strings are driven as a total of 256 (4*32*2) pages.

The conventional non-volatile memory device having a 3-D structure has the following features.

First, packaging is difficult. The size of a page (more specifically, the number of memory cells included in one page) is increasing. In the conventional structure, the X axis of a chip must be greatly increased to increase the size of the page. Accordingly, a standard package size cannot be implemented.

Second, a conventional controller and application products cannot be used. The number of pages included in one memory block of the conventional non-volatile memory device having a 3-D structure is greater than that of a non-volatile memory device having a 2-D structure because strings included in one string column are driven as respective pages. For example, if the conventional non-volatile memory device having a 3-D structure includes four strings each including 32 memory cells that are driven as an MLC, the memory cells are driven as a total of 256 pages. Accordingly, a new controller and application products are to be developed.

Third, as the number of pages included in one memory block increases, interference between memory cells is increased, and a distribution of the threshold voltages of programmed memory cells is deteriorated.

Fourth, an increase in the degree of integration of the non-volatile memory devices having a 3-D structure is reaching a limit. In the conventional structure, a reduction in the line width is limited because the diameter of a channel, and the thickness of a tunnel insulating layer, a charge trap layer, and a charge blocking layer, and an interval between strings must be secured. In order to improve the degree of integration, the number of memory cells stacked must be increased. If the number of memory cells stacked increases, however, the process that forms the conventional non-volatile memory devices having a 3-D structure may become more difficult.

BRIEF SUMMARY

Exemplary embodiments relate to a non-volatile memory device having a 3-D structure that may reduce the number of pages necessary to drive one memory block by increasing the size of a page, and a method of manufacturing the same.

In accordance with an aspect of the present disclosure, there is provided A non-volatile memory device having a three-dimensional (3-D) structure, comprising: a plurality of strings each including a drain select transistor, drain-side memory cells, a pipe transistor, source-side memory cells, and a source select transistor coupled in series, wherein the plurality of strings are arranged in a first direction and a second direction crossing the first direction, and the strings arranged in the second direction form each of string columns; a plurality of bit lines extended in the second direction and coupled to the drain select transistors of the strings included in each string column; and a plurality of source lines extended in the first direction and in common coupled to the source select transistors of strings adjacent to each other in the second direction, wherein strings included in one of the string columns are staggered in the first direction and each of the string columns are coupled to at least two of the bit lines.

In accordance with another aspect of the present disclosure, there is provided a method of manufacturing a method of manufacturing a non-volatile memory device having a three-dimensional (3-D) structure, the method comprising: forming a plurality of memory cells stacked along a plurality of U-shaped channels, each comprising a pipe channel, a drain-side channel and a source-side channel, wherein the plurality of U-shaped channels are arranged in a first direction and a second direction crossing the first direction, and the U-shaped channels arranged in the second direction form a channel column, wherein the strings included in a channel column are staggered in the first direction.

BRIEF DESCRIPTION OF THE DRAWINGS

FIGS. 1A and 1B are layout diagrams of a conventional U-shaped channel type non-volatile memory device;

FIGS. 7A and 7B are a layout diagram of a non-volatile memory device having a 3-D structure according to a second embodiment of this disclosure and a circuit diagram illustrating part of the cell array of the non-volatile memory device;

DESCRIPTION OF EMBODIMENTS

Hereinafter, some exemplary embodiments of the present disclosure will be described in detail with reference to the accompanying drawings. The figures are provided to allow those having ordinary skill in the art to understand the scope of the embodiments of the disclosure.

Figure 2:
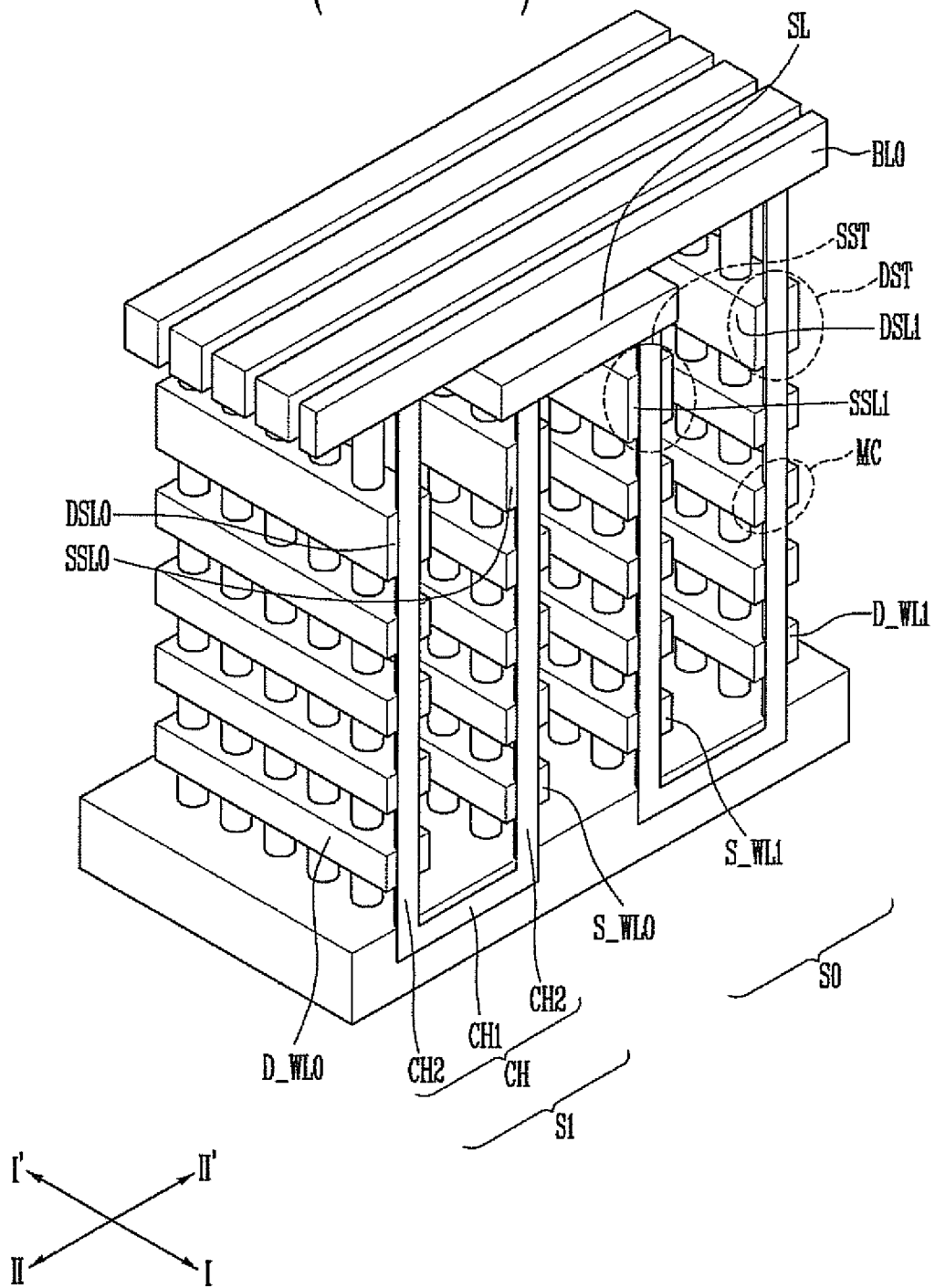
FIG. 2 is a perspective view illustrating the structure of the conventional non-volatile memory device having a 3-D structure.
Figure 3A:
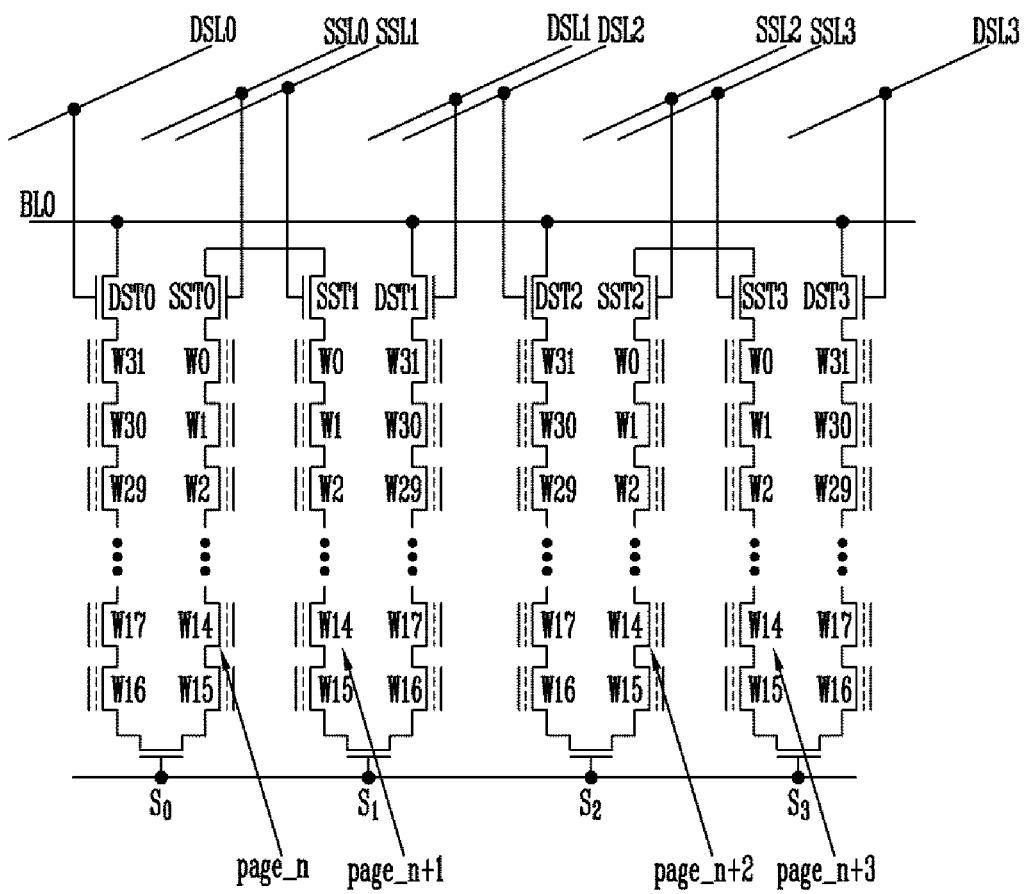
FIG. 3A is a circuit diagram illustrating part of the cell array of the conventional non-volatile memory device having a 3-D structure.
Figure 3B:
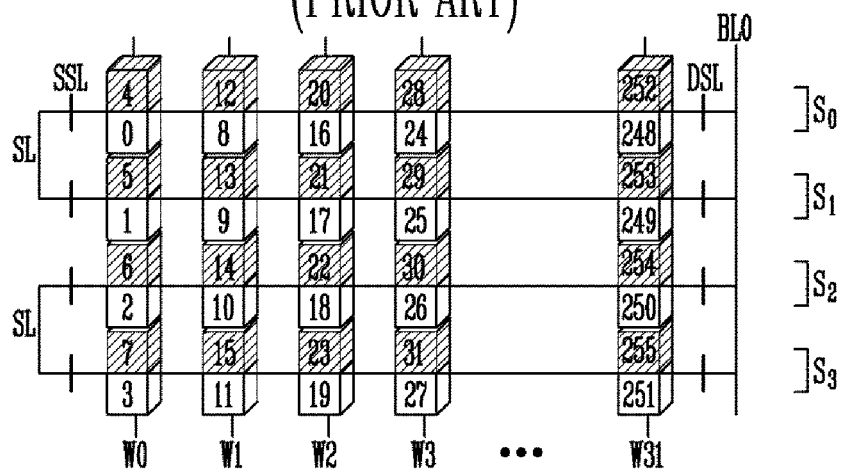
FIG. 3B is a diagram illustrating the page numbers of the conventional non-volatile memory device having a 3-D structure.
Figure 4A:
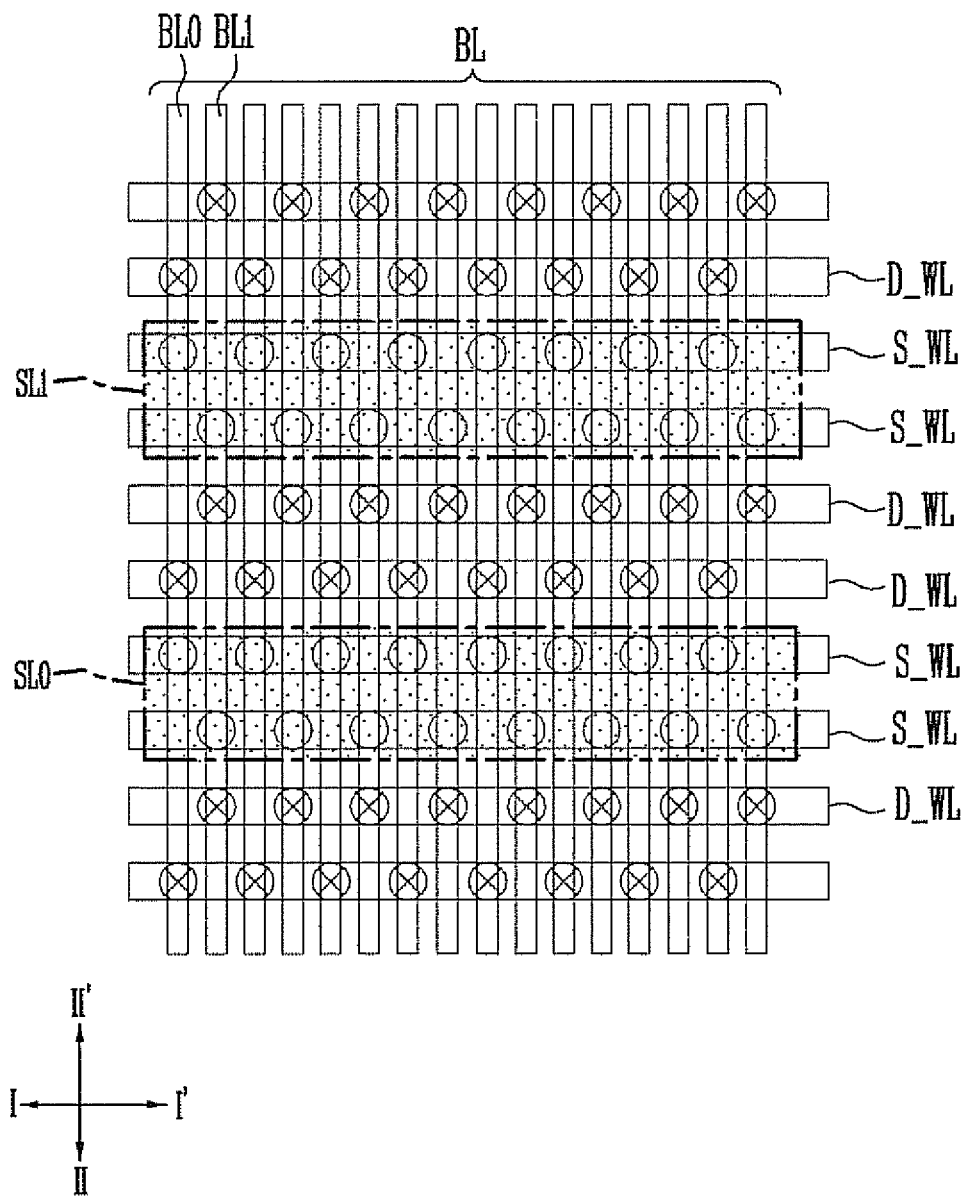
FIGS. 4A and 4B are layout diagrams of a U-shaped channel type non-volatile memory device according to a first embodiment of this disclosure.
Figure 4B:
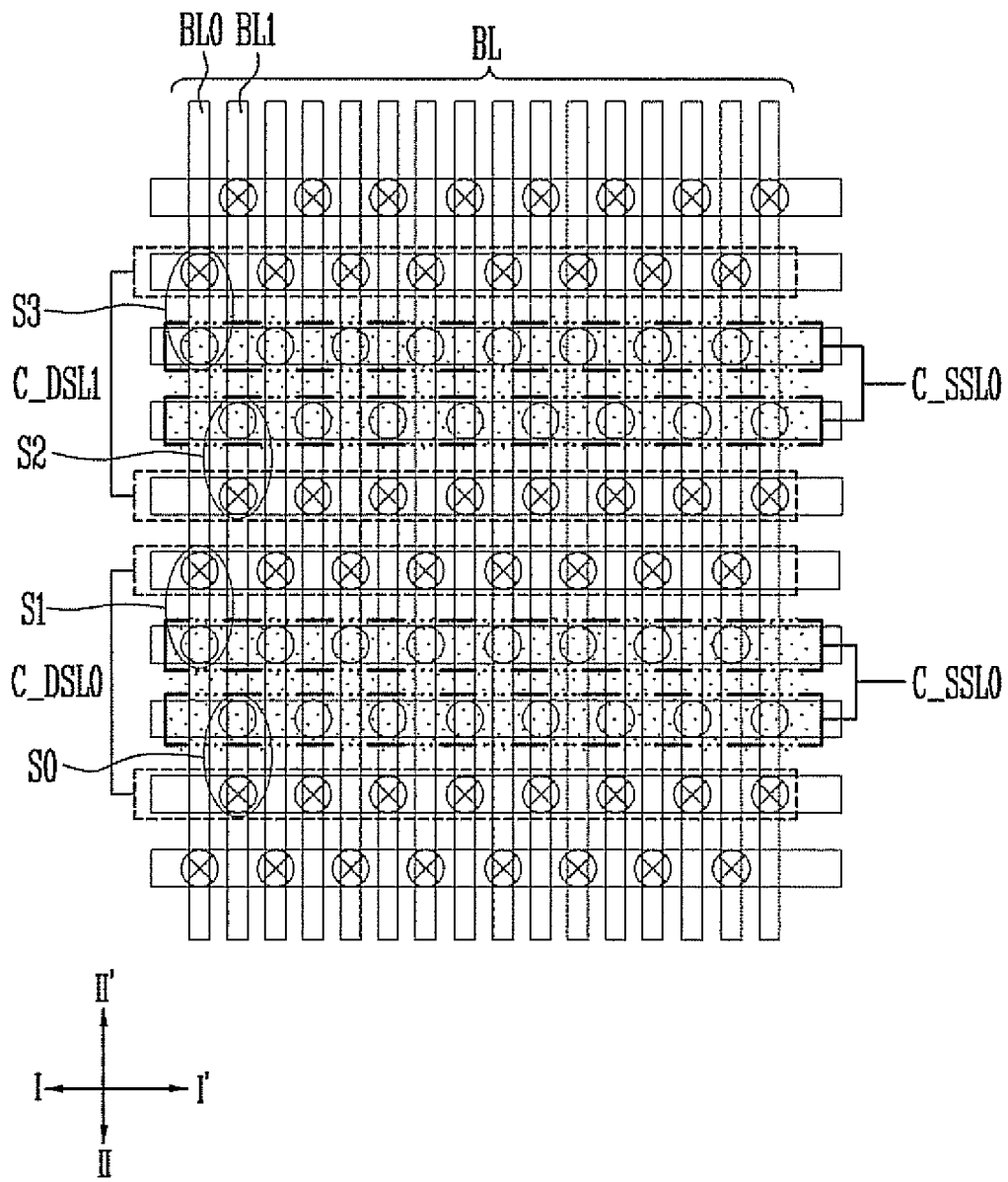

FIGS. 4A and 4B are layout diagrams of a U-shaped channel type non-volatile memory device according to a first embodiment of this disclosure.

In the U-shaped channel type non-volatile memory device of the first embodiment, a drain contact plug and a source contact plug coupled to one string are arranged on the same line. Odd-numbered strings S1 and S3 and even-numbered strings S0 and S2 are coupled to respective bit lines BL0 and BL1 included in a plurality of bit lines BL. Strings included in each string column are staggered in a first direction I-I' and are coupled to two bit lines.

As shown, the U-shaped channel type non-volatile memory device includes a plurality of the odd and even-numbered strings S0 to S3 arranged in the first direction I-I' and a second direction II-II'. The strings S0 to S3 extended in the second direction II-II' and included in one string column are arranged in zigzags on the bit lines BL.

The U-shaped channel type non-volatile memory device includes a plurality of drain-side word lines D_WL and a plurality of source-side word lines S_WL, which are extended in parallel in the first direction I-I'. The plurality of drain-side word lines D_WL and the plurality of source-side word lines S_WL are alternately arranged.

The plurality of drain-side word lines D_WL and the plurality of source-side word lines S_WL are arranged in a stack form. A plurality of the drain-side word lines D_WL formed in the same level are interconnected, and a plurality of the source-side word lines S_WL formed in the same level are interconnected.

The U-shaped channel type non-volatile memory device further includes a plurality of source lines SL extended in parallel to the first direction I-I' on the plurality of source-side word lines S_WL.

The plurality of bit lines BL extend in parallel in the second direction II-II'. One string column is coupled to at least two of the bit lines BL. In the drawings, the drain contact plugs are indicated by symbols ⓧ, and the source contact plugs are indicated by symbols ○.

Figure 5:
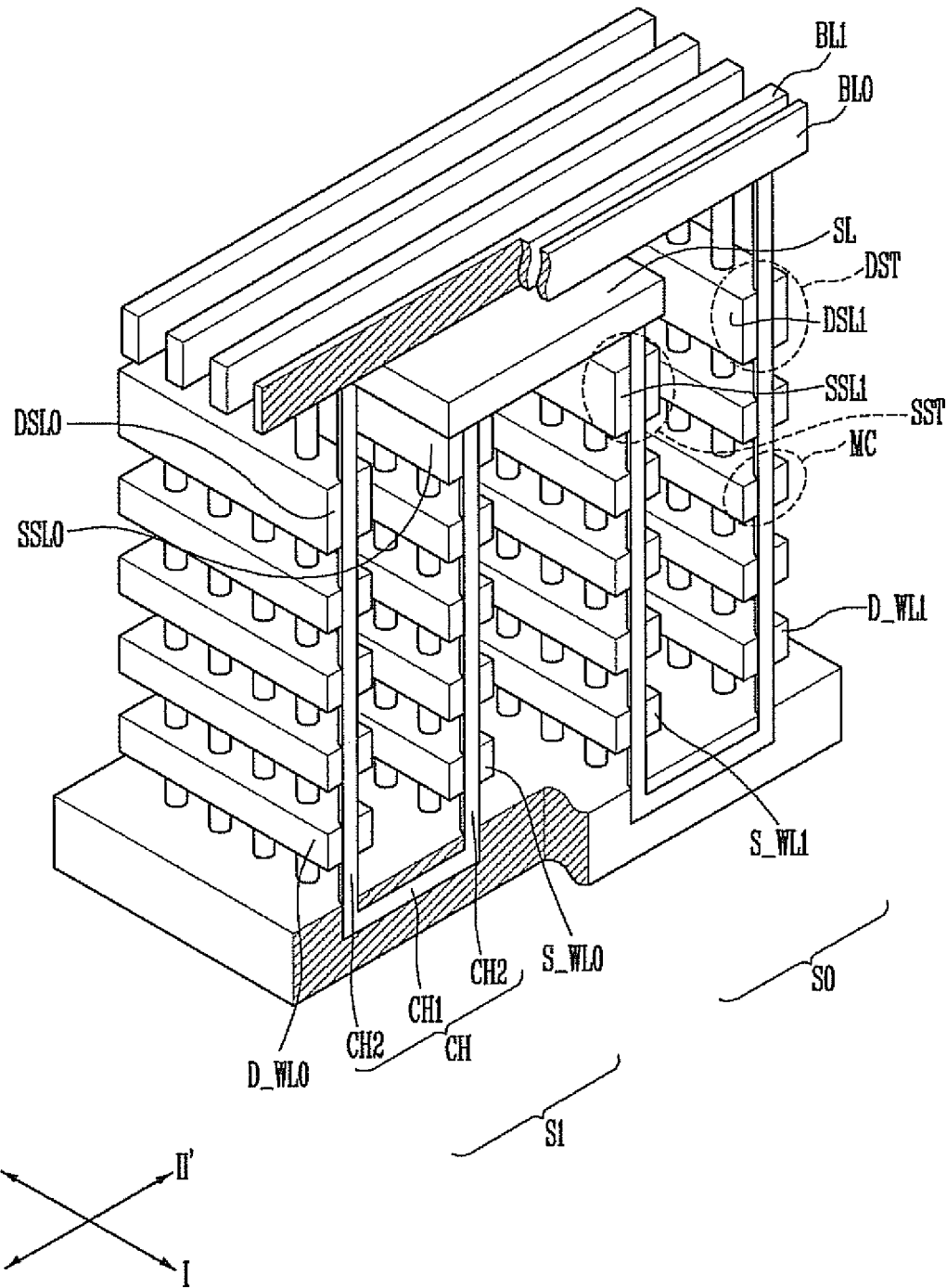
FIG. 5 is a perspective view showing the structure of the non-volatile memory device having a 3-D structure according to the first embodiment of this disclosure.

FIG. 5 is a perspective view illustrating the structure of the non-volatile memory device having a 3-D structure according to the first embodiment of this disclosure. Interlayer dielectric layers are not shown in FIG. 5, for illustration purposes.

A method of manufacturing the non-volatile memory device according to the first embodiment is described below.

First, a plurality of first trenches arranged in the first direction I-I' and the second direction II-II' are formed by etching a pipe gate. Here, a trench column extended in the second direction II-II' is arranged in zigzags.

A sacrificial layer is buried in the plurality of first trenches. The sacrificial layer may be a nitride layer, a titanium nitride layer, or the like.

A plurality of first material layers and a plurality of second material layers are alternately formed over the substrate including the sacrificial layer. The first material layers are used to form word lines and common select lines, and the second material layers are used to electrically isolate the word lines and the common select lines from one another. The first material layers and the second material layers are made of materials having a high etch selectivity.

For example, the first material layer may be formed of a conductive layer, such as a polysilicon layer, and the second material layer may be formed of an insulating layer, such as an oxide layer. For another example, the first material layer may be formed of a conductive layer, such as a doped polysilicon layer or a doped amorphous silicon layer, and the second material layer may be formed of a sacrificial layer, such as an undoped polysilicon layer or an undoped amorphous silicon layer. For yet another example, the first material layer may be formed of a sacrificial layer, such as a nitride layer, and the second material layer may be formed of an insulating layer, such as an oxide layer.

Next, a plurality of second trenches coupled to the first trenches are formed by etching the plurality of first material layers and the plurality of second material layers. For example, the plurality of second trenches may be formed so that a pair of the second trenches is coupled to one of the first trenches.

After the first sacrificial layer exposed at the bottom of the second trenches is removed, a charge blocking layer, a charge trap layer, and a tunnel insulating layer are sequentially formed in the first trenches and the second trenches. For example, if the first material layer is formed of a sacrificial layer and the second material layer is formed of an interlayer dielectric layer, a passivation layer may be formed on inner walls of the second trenches to protect the first material layers in the process of removing the first sacrificial layer. The passivation layer may be removed before forming the charge blocking layer, the charge trap layer, and the tunnel insulating layer.

Channel layers are formed in the first trench and the pair of second trenches in which the charge blocking layer, the charge trap layer, and the tunnel insulating layer are formed. Thus, a plurality of U-shaped channels is formed. Each U-shaped channel includes a pipe channel CH1 buried in the pipe gate and a drain-side channel CH2 and a source-side channel CH2. The drain-side channel CH2 and the source-side channel CH2 are both coupled to the pipe channel CH1. Here, the drain-side channel CH2 and the source-side channel CH2 extend vertically from the pipe gate, and a plurality of memory cells MC are stacked along each of the U-shaped channels.

The plurality of memory cells MC includes drain-side memory cells staked along the drain-side channel CH2 and source-side memory cells stacked along the source-side channel CH2. Here, the drain-side memory cells and the source-side memory cells are connected by a pipe transistor. Thus, the drain-side memory cells, the pipe transistor, and the source-side memory cells are connected in series between a drain select transistor DST and a source select transistor SST, and form one string.

Next, the plurality of first material layers and the plurality of second material layers between the pair of second trenches are etched to form slits that each separate word lines, coupled to a plurality of the memory cells included in one string, from each other. In addition, the plurality of first material layers and the plurality of second material layers between adjacent strings may be further etched to form slits that each separate the source-side word lines S_WL and the drain-side word lines D_WL of the adjacent strings from each other. An example in which the slit is formed between the second trenches adjacent to each other is shown in the drawings, but the slit may be formed, for example, only between the second trenches forming one string. In this case, adjacent strings share a word line.

Next, additional processes may be performed depending on materials used as the first material layers and the second material layers.

For example, if the first material layer is formed of a conductive layer and the second material layer is formed of an insulating layer, the first material layers exposed by the slits may be silicided, and an insulating layer may be subsequently buried in the slits. Thus, the process of manufacturing memory cells is completed.

For another example, if the first material layer is formed of a conductive layer and the second material layer is formed of a sacrificial layer, the second material layers exposed by the slits are removed. An insulating layer is buried in the slits and in the regions where the second material layers have been removed. Thus, the process of manufacturing memory cells is completed.

For yet another example, if the first material layer is formed of a sacrificial layer and the second material layer is formed of an insulating layer, the first material layers exposed by the slits are removed. Word lines, common select lines, etc. are formed by burying a conductive layer, such as tungsten (W), in the regions where the first material layers have been removed. Next, an insulating layer is buried in the slits. Thus, the process of manufacturing memory cells is completed. In some embodiments, before burying the conductive layer, an oxide layer or a stack layer including, for example, an oxide layer and an aluminum oxide ($Al_2O_3$) layer, may be formed inside the regions where the first material layers have been removed to further form a charge blocking layer. In some embodiments, before further forming the charge blocking layer, the charge blocking layer within the second trenches, which is damaged in the process of removing the first material layers, may be removed.

Accordingly, a plurality of drain-side word line structures and a plurality of source-side word line structures are formed. The plurality of drain-side word line structures each includes a plurality of interlayer dielectric layers (not shown) alternately stacked over the substrate with the plurality of drain-side word lines D_WL and extended in parallel in the first direction I-I'. The plurality of source-side word line structures includes a plurality of interlayer dielectric layers (not shown) alternately stacked over the substrate with the plurality of source-side word lines S_WL and extended in parallel in the first direction I-I'. The plurality of source-side word line structures are alternately formed with the plurality of drain-side word line structures, Here, the drain-side channel CH2 is formed through the drain-side word line structures, and the source-side channel CH2 is formed through the source-side word line structures. Since the plurality of source-side word lines S_WL formed in the same level are interconnected, the source-side memory cells formed in the same level share the source-side word line S_WL. Likewise, since the plurality of drain-side word lines D_WL formed in the same level are interconnected, the drain-side memory cells formed in the same level share the drain-side word line D_WL.

Meanwhile, in accordance with this disclosure, the word lines and the common select lines may be formed by one process or may be formed by separate processes.

If the common select lines are formed by a separate process, a first interlayer dielectric layer, a conductive layer, and a second interlayer dielectric layer are formed over the plurality of memory cells. Subsequently, a trench is formed that exposes a surface of the channel of the highest memory cell. After a gate insulating layer is formed on the inner wall of the trench, a layer for channels is buried in the trench. Next, a plurality of common drain select lines and a plurality of common source select line extended in parallel to in the first direction I-I' are formed by patterning the second interlayer dielectric layer, the conductive layer, and the first interlayer dielectric layer.

Next, after a plurality of source contact plugs are formed, a plurality of source lines SL extended in parallel in the second direction II-II' are formed. After a plurality of drain contact plugs are formed, a plurality of bit lines BL extended in parallel in the second direction II-II' are formed.

Figure 6A:
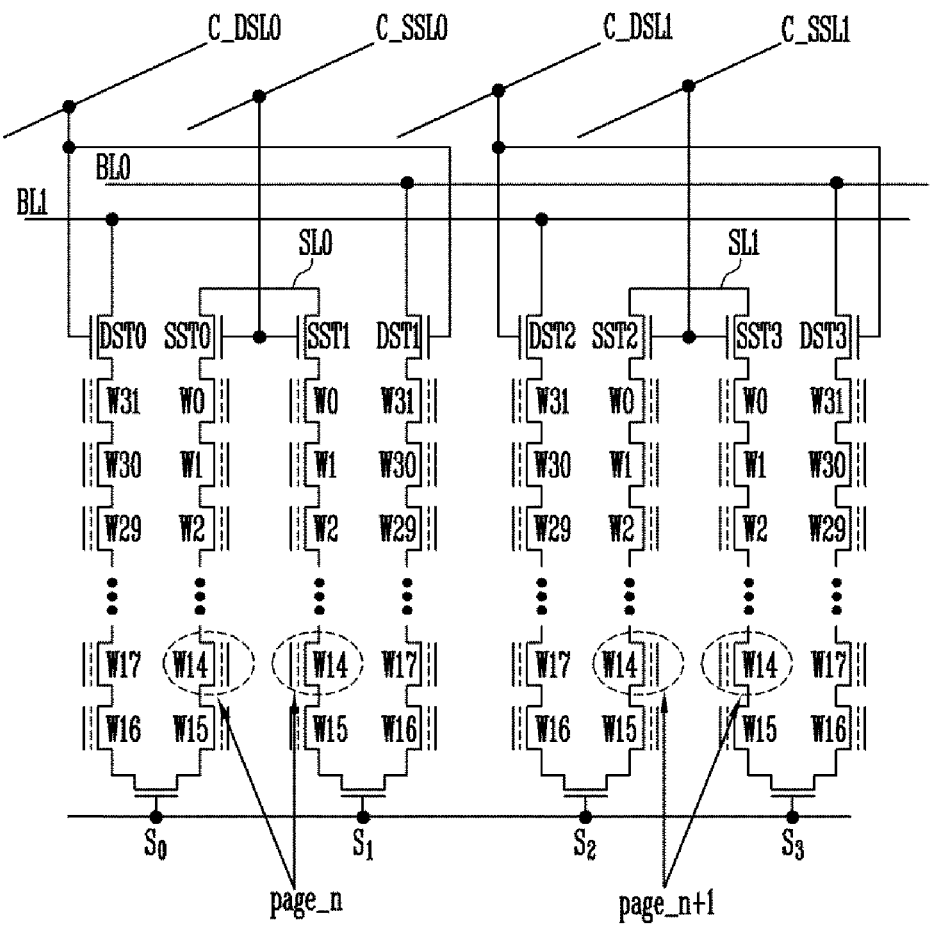
FIG. 6A is a circuit diagram illustrating part of the cell array of the non-volatile memory device having a 3-D structure according to the first embodiment of this disclosure.

FIG. 6A is a circuit diagram illustrating part of the cell array of the non-volatile memory device having a 3-D structure according to the first embodiment of this disclosure. The cell array of FIG. 6A illustrates the cell array including strings S0 to S3 coupled to the bit lines BL0 and BL1 of FIG. 4.

As shown, the strings S0 to S3 included in one of the string columns extended in the second direction II-II' are coupled to the bit lines BL0 and BL1. More specifically, the odd-numbered strings S1 and S3 are coupled to the bit line BL1, and the even-numbered strings S0 and S2 are coupled to the bit line BL0.

The drain select transistors DST0 and DST1 of two strings S0 and S1 coupled to different bit lines, from among the strings S0 to S3 included in one string column, are in common controlled by a common drain select line C_DSL0. Furthermore, the source select transistors SST0 and SST1 of two strings S0 and S1 coupled to different bit lines, from among the strings S0 to S3 included in one string column, are in common controlled by a common source select line C_SSL0.

In accordance with this structure, regarding the two strings S0 and S1 coupled to different bit lines, from among the strings included in the same string column, the source-side memory cells MC formed in the same level or the drain-side memory cells MC formed in the same level can be driven as belonging to the same page. For example, when a source-side word line WL14 is driven, an operation according to a total of two pages page_n and page_n+1 is performed by controlling the common drain select lines C_DSL0 to C_DSL3 and the common source select lines C_SSL0 to C_SSL3.

Accordingly, when a program operation or a read operation is performed, source-side memory cells and drain-side memory cells included in one string are driven as different pages. Furthermore, strings connected to different bit lines and controlled by the same common drain select line and the same common source select line are driven as single page.

Table 1 is a table showing detailed operating conditions on the non-volatile memory device having a 3-D structure according to the first embodiment of this disclosure.

TABLE 1

|  | READ | PROGRAM | ERASE |
| --- | --- | --- | --- |
| Selected BL | 1 V | 0 V | Vers |
| Unselected BL | 0 V | Vcc |  |
| Selected WL | Vread | Vpgm | 0 V |
| Unselected WL | Von | Vpass |  |
| Selected C_DSL | Vcc | 0 V | delayed |
| Unselected C_DSL | 0 V | Vcc | Vers |
| Selected C_SSL | Vcc | 0 V |  |
| Unselected C_SSL | 0 V | 0 V |  |
| SL | 0 V | Vcc | Vers |

Referring to Table 1, in a read operation, 1 V is supplied to a selected bit line BL, and the unselected bit lines BL are grounded. A read voltage Vread for turning on or off memory cells is supplied to a selected word line WL depending on whether the memory cells are programmed, and a turn-on voltage Von for turning on memory cells is supplied to the unselected word lines WL irrespective of whether the memory cells are programmed. Furthermore, the source line SL is grounded.

At this time, a common drain select line C_DSL and a common source select line C_SSL, selected from the plurality of common drain select lines C_DSL and the plurality of common source select lines C_SSL coupled to strings included in one string column, are activated (for example, an operating voltage Vcc is supplied), and the unselected common drain select lines C_DSL and the unselected common source select lines C_SSL are deactivated (for example, grounded).

In a program operation, a selected bit line BL is grounded, and the operating voltage Vcc is supplied to the unselected bit lines BL. A program voltage Vpgm is supplied to a selected word line WL, and a pass voltage Vpass is supplied to the unselected word lines WL. Furthermore, the operating voltage Vcc is supplied to the source line SL.

At this time, a common drain select line C_DSL, selected from the plurality of common drain select lines C_DSL coupled to strings included in one string column, is deactivated (for example, grounded), and the unselected common drain select lines C_DSL are activated (for example, the operating voltage Vcc is supplied). The plurality of common source select lines C_SSL coupled to the strings included in the string column are deactivated (for example, grounded).

In an erase operation, an erase voltage Vers is supplied to the bit lines BL, the word lines WL are grounded, and the erase voltage Vers is supplied to the source lines SL. A delayed erase voltage delayed Vers is supplied to the common drain select lines C_DSL and the common source select lines C_SSL.

Figure 6B:
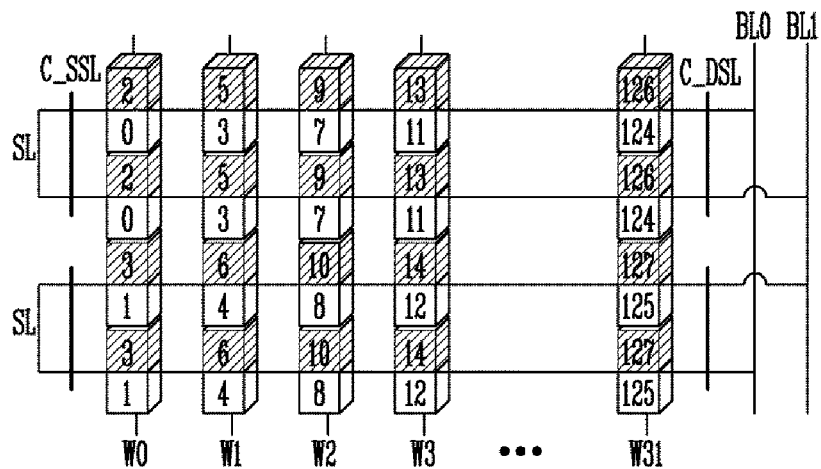
FIG. 6B is a diagram illustrating the page numbers of the non-volatile memory device having a 3-D structure according to the first embodiment of this disclosure.

FIG. 6B is a diagram illustrating the page numbers of the non-volatile memory device having a 3-D structure according to the first embodiment of this disclosure. The page numbers of FIG. 6B illustrates the page numbers of the cell array shown in FIG. 6A.

As shown, in a device in which 32 memory cells are included in one string and are driven as MLCs, memory cells included in four strings can be driven as a total of 128 (2*32*2) pages because two strings can be driven at the same time.

Figure 7B:
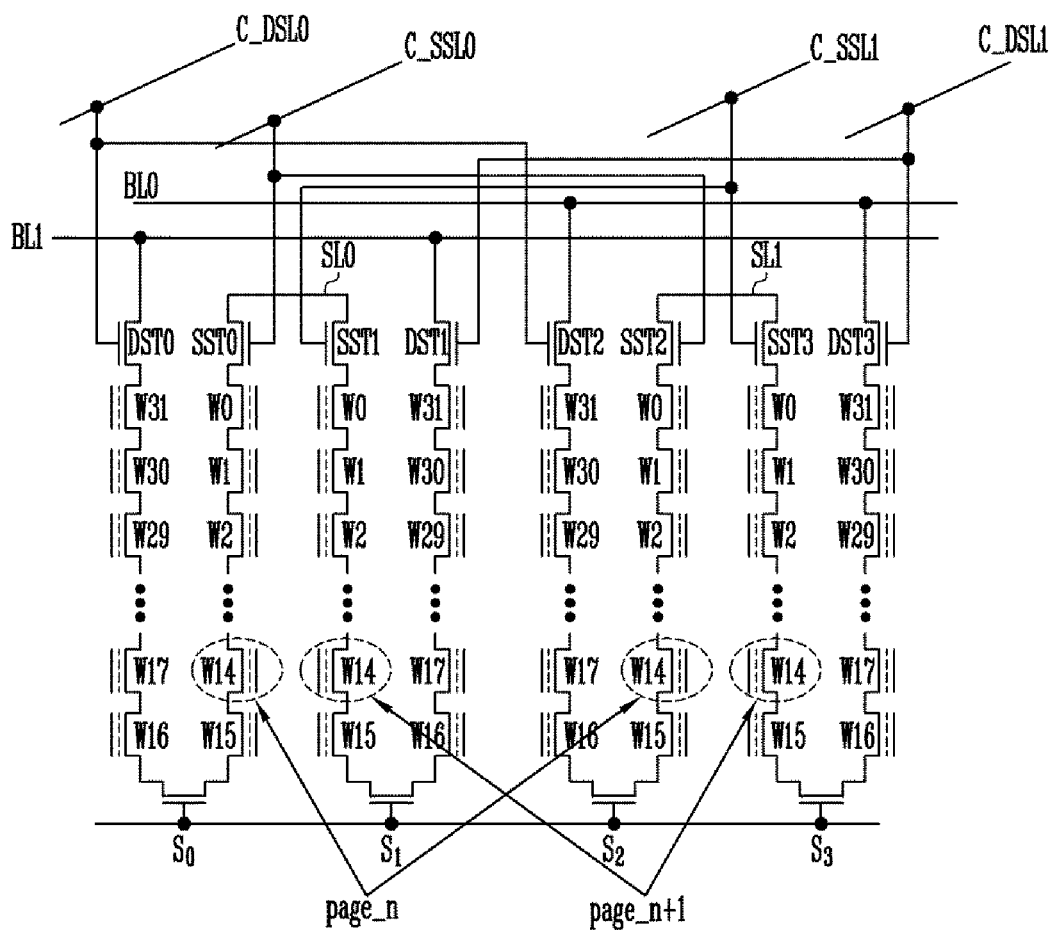

FIGS. 7A and 7B are a layout diagram of a non-volatile memory device having a 3-D structure according to a second embodiment of this disclosure and a circuit diagram illustrating part of the cell array of the non-volatile memory device.

In the second embodiment of this disclosure, a drain contact plug and a source contact plug coupled to one string are arranged on the same line, and strings S0 to S3 included in one string column are arranged in zigzags along bit lines BL in pairs. In particular, strings configured to be adjacent to each other in a second direction II-II' and to share the same source line SL are coupled to the same bit line BL, and one string column is coupled to two bit lines BL0 and BL1. Here, the drain contact plugs belonging to units adjacent to each other in the second direction II-II' are arranged in staggered form.

In other words, the strings S0 and S1 sharing a source line SL0 are coupled to the bit line BL1, and the strings S2 and S3 sharing a source line SL1 are coupled to the bit line BL0.

Two strings coupled to respective bit lines BL, from among strings included in one string column, are controlled by a common drain select line C_DSL and a common source select line C_SSL. In other words, the strings S0 and S2 coupled to the respective bit lines BL1 and BL0 are controlled by a common drain select line C_DSL0 and a common source select line C_SSL0, and the string S1 and S3 coupled to the respective bit lines BL1 and BL0 are controlled by a common drain select line C_DSL1 and a common source select line C_SSL3.

Accordingly, when, for example, source-side word lines WL14 are activated, source-side memory cells belonging to the strings S0 and S3 are driven as one page page_n, and source-side memory cells belonging to the strings S1 and S2 are driven as one page page_n+1.

Figure 8A:
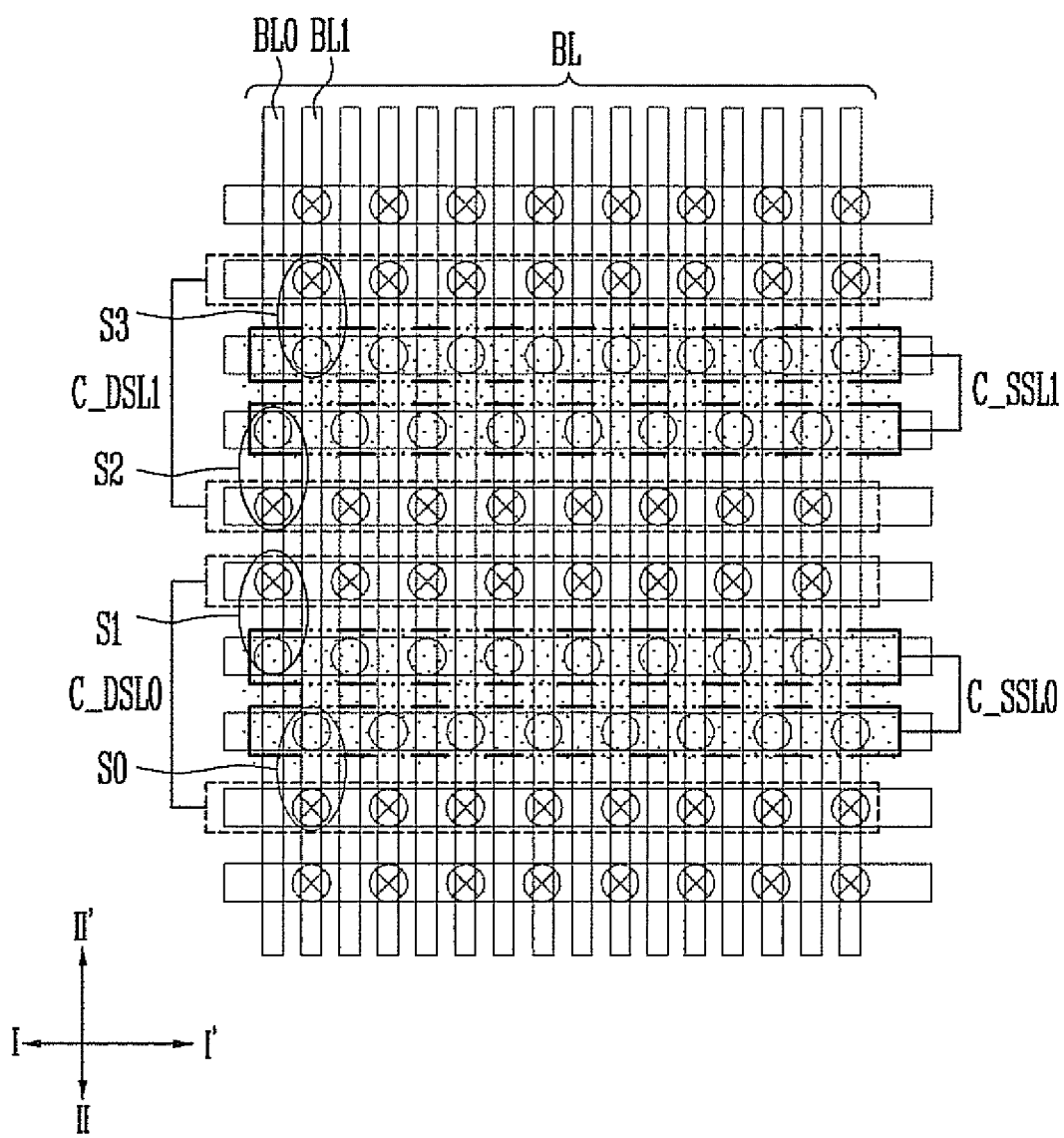
FIGS. 8A and 8B are a layout diagram of a non-volatile memory device having a 3-D structure according to a third embodiment of this disclosure and a circuit diagram illustrating part of the cell array of the non-volatile memory device.
Figure 8B:
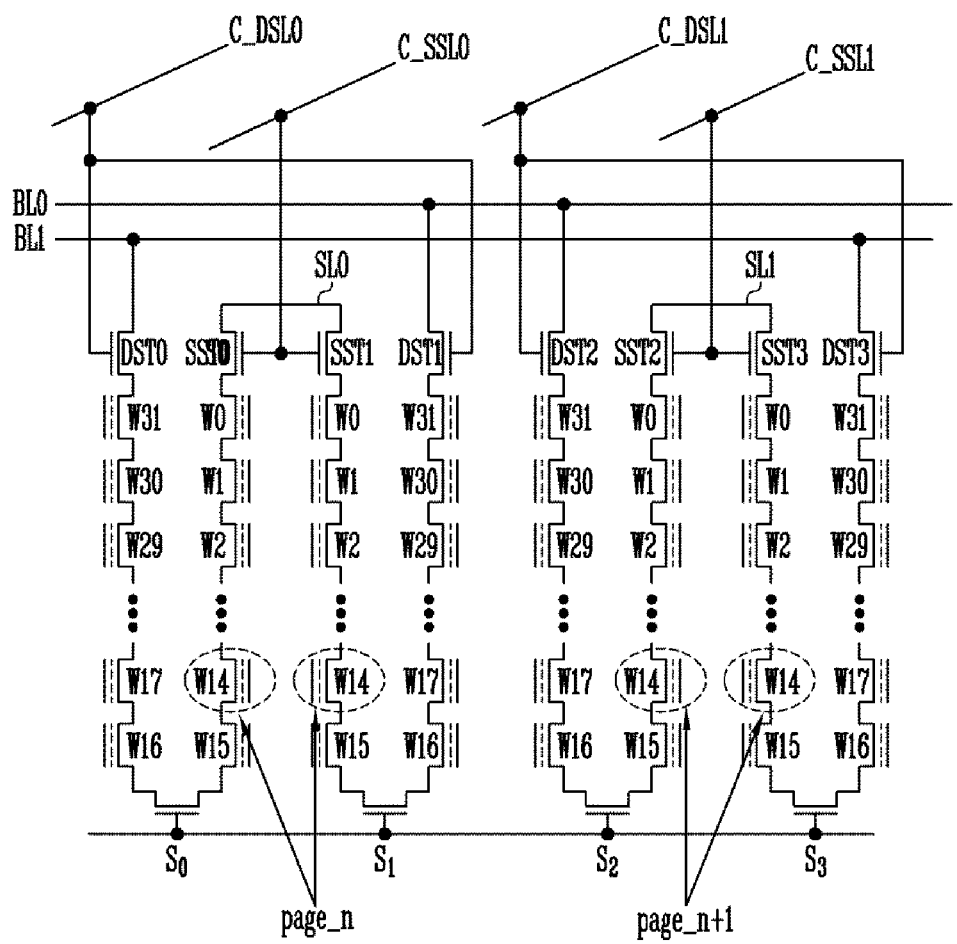

FIGS. 8A and 8B are a layout diagram of a non-volatile memory device having a 3-D structure according to a third embodiment of this disclosure and a circuit diagram illustrating part of the cell array of the non-volatile memory device.

In the third embodiment of this disclosure, a drain contact plug and a source contact plug coupled to one string are arranged on the same line, and strings S0 to S3 included in one string column are arranged in zigzags along bit lines BL in pairs. In particular, strings configured to be adjacent to each other in a second direction II-II' and to share the same source line SL are coupled to different bit lines BL, and thus one string column is coupled to two bit lines BL0 and BL1. Here, the source contact plugs adjacent to each other in the second direction II-II' are arranged in staggered form.

In other words, the strings S0 and S1 sharing a source line SL0 are coupled to the respective bit lines BL1 and BL0, and the strings S2 and S3 sharing a source line SL1 are coupled to the respective bit lines BL0 and BL1.

Here, two strings coupled to different bit lines BL, from among strings included in one string column, are controlled by a common drain select line C_DSL and a common source select line C_SSL. In other words, the strings S0 and S2 coupled to the respective bit lines BL1 and BL0 are controlled by a common drain select line C_DSL0 and a common source select line C_SSL0, and the string S1 and S3 coupled to the respective bit lines BL0 and BL1 are controlled by a common drain select line C_DSL1 and a common source select line C_SSL3.

Accordingly, when, for example, source-side word lines WL14 are activated, source-side memory cells belonging to the strings S0 and S1 are driven as one page page_n, and source-side memory cells belonging to the strings S2 and S3 are driven as one page page_n+1.

Figure 9A:
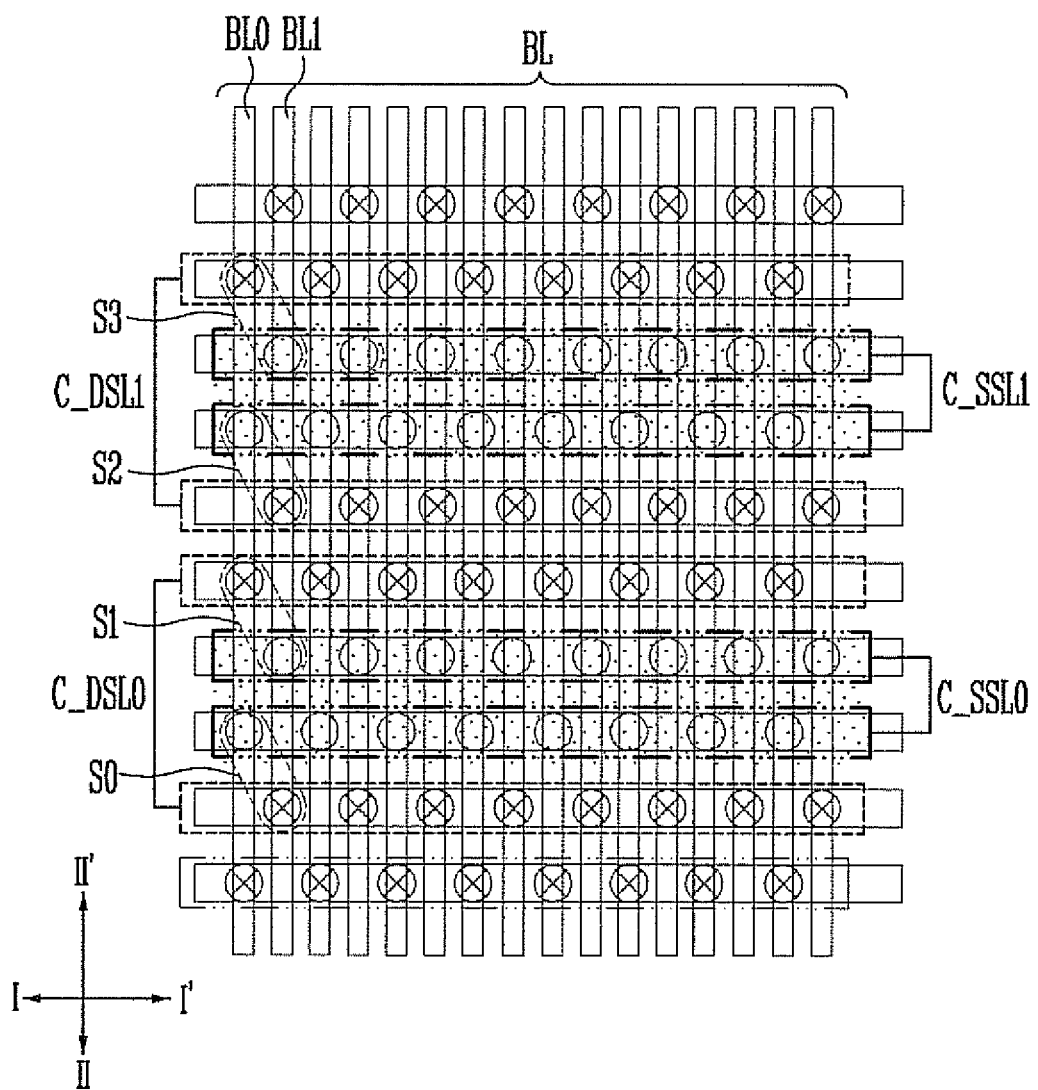
FIGS. 9A and 9B are a layout diagram of a non-volatile memory device having a 3-D structure according to a fourth embodiment of this disclosure and a circuit diagram illustrating part of the cell array of the non-volatile memory device.
Figure 9B:
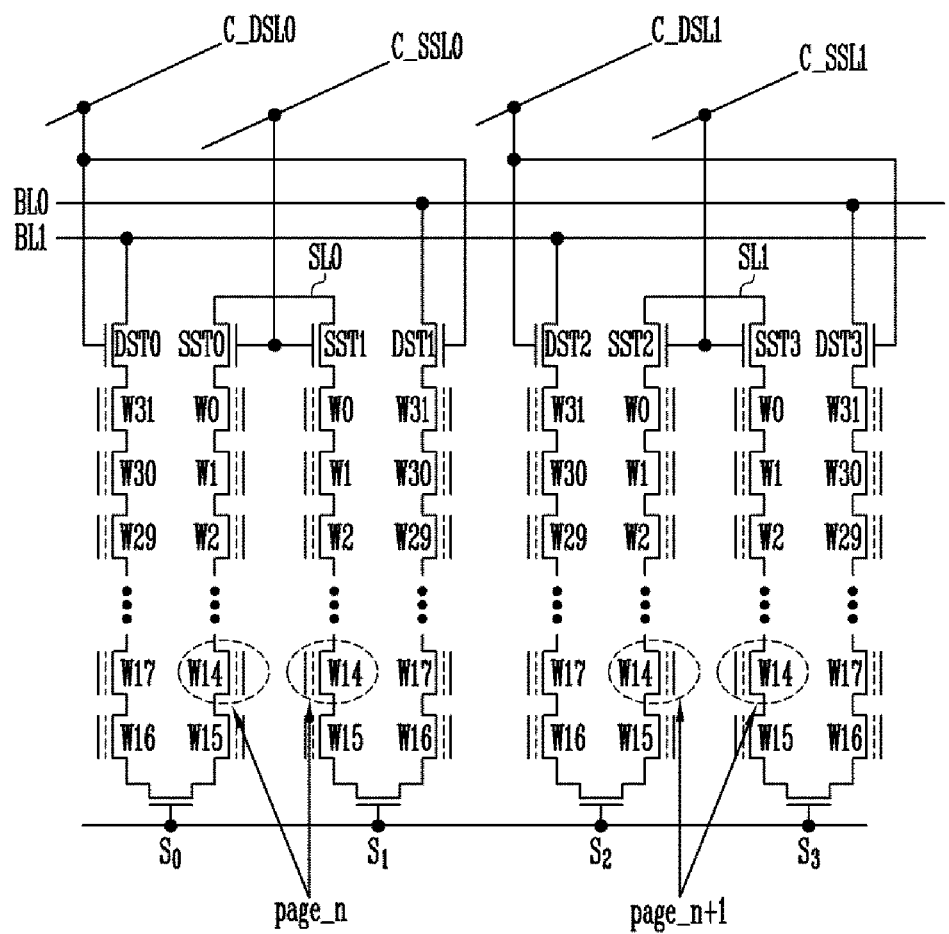

FIGS. 9A and 9B are a layout diagram of a non-volatile memory device having a 3-D structure according to a fourth embodiment of this disclosure and a circuit diagram illustrating part of the cell array of the non-volatile memory device.

In the fourth embodiment of this disclosure, a drain contact plug and a source contact plug coupled to one string are arranged staggered in a first direction I-I', and strings included in one string column are arranged in staggered form (that is, the strings included in one string column are arranged in zigzags, so that center of the drain contact plug and the source contact plug are offset in the first direction I-I'). In particular, each of the odd-numbered strings S1 and S3 and the even-numbered strings S0 and S2 is coupled to different bit lines BL0 and BL1, and thus one string column is coupled to the two bit lines BL0 and BL1. The drain contact plugs adjacent to each other in a second direction II-II' are staggered from each other, and the source contact plugs adjacent to each other in the second direction II-II' are staggered from each other.

More specifically, the drain contact plugs of the odd-numbered strings S1 and S3 included in one string column are coupled to the bit line BL0, and the drain contact plugs of the even-numbered strings S0 and S2 therein are coupled to the bit line BL1.

Two strings included in one string column and coupled to different bit lines BL are controlled by a common drain select line C_DSL and a common source select line C_SSL. More specifically, the strings S0 and S1 included in one string column and coupled to the respective bit lines BL1 and BL0 are controlled by a common drain select line C_DSL0 and a common source select line C_SSL0, and the strings S2 and S3 included in one string column and coupled to the respective bit lines BL1 and BL0 are controlled by a common drain select line C_DSL1 and a common source select line C_SSL1.

Accordingly, when source-side word lines WL14 are activated, source-side memory cells belonging to the strings S0 and S1 are driven as one page page_n, and source-side memory cells belonging to the strings S2 and S3 are driven as one page page_n+1.

Figure 10A:
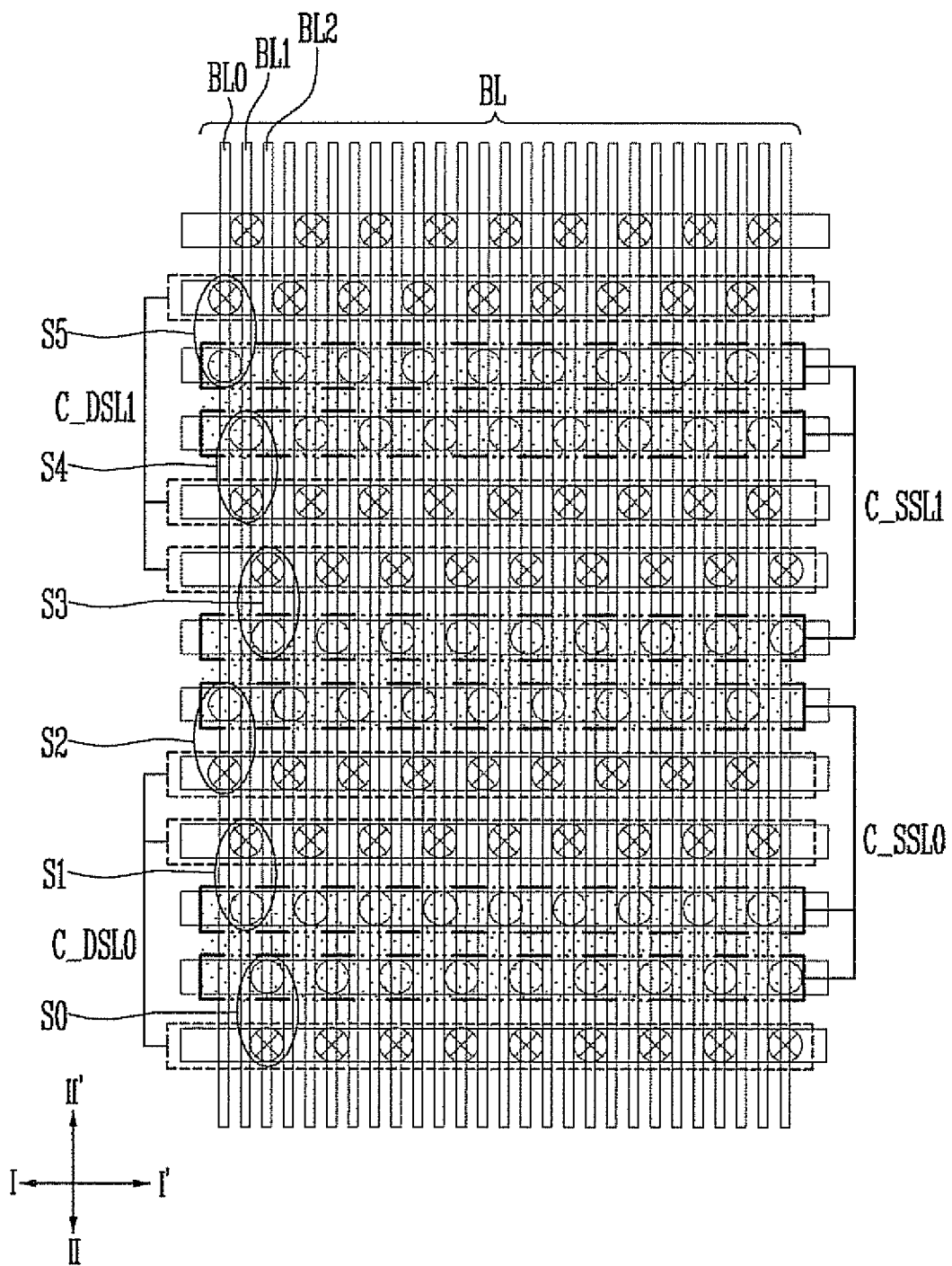
FIGS. 10A and 10B are a layout diagram of a non-volatile memory device having a 3-D structure according to a fifth embodiment of this disclosure and a circuit diagram illustrating part of the cell array of the non-volatile memory device.
Figure 10B:
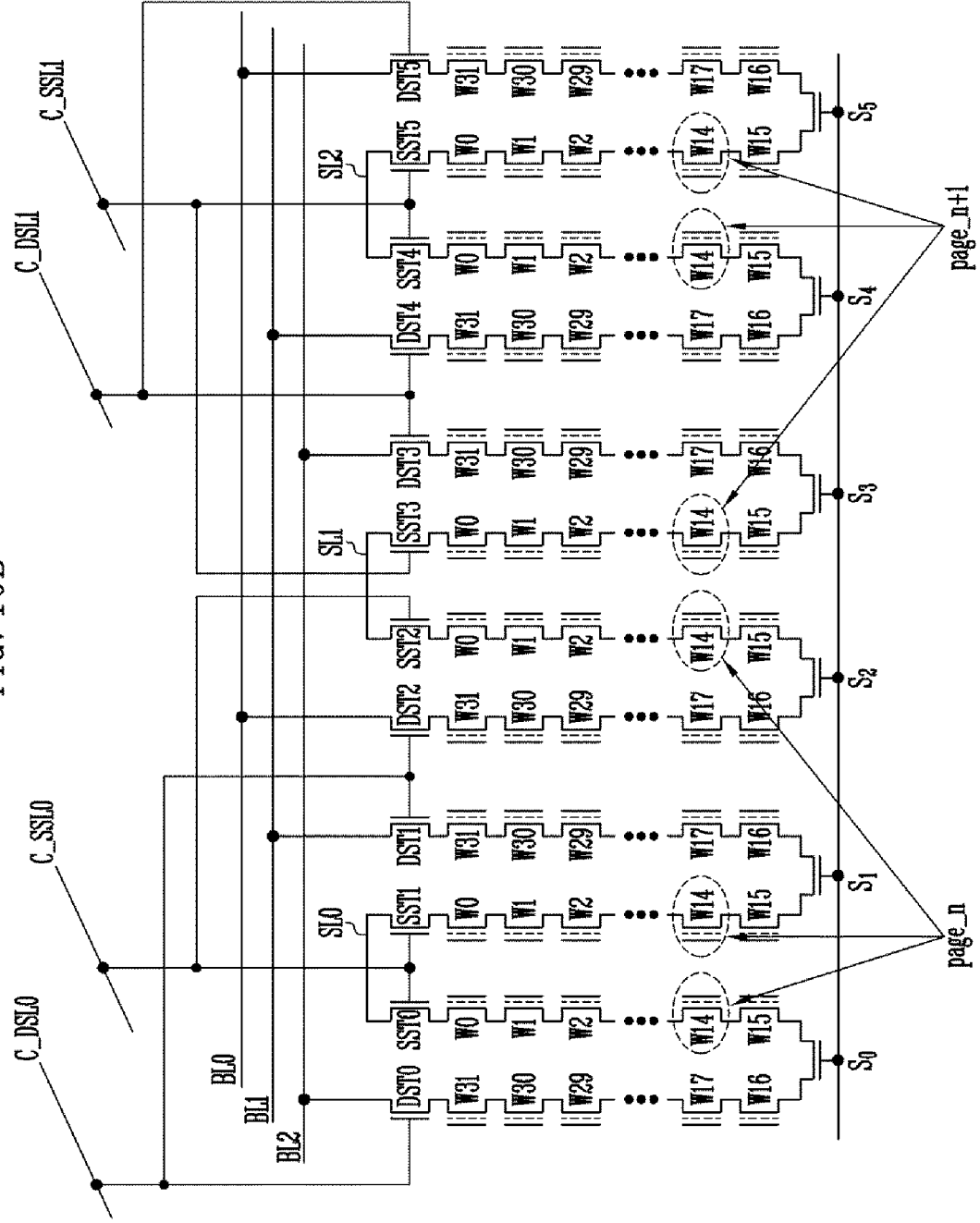

FIGS. 10A and 10B are a layout diagram of a non-volatile memory device having a 3-D structure according to a fifth embodiment of this disclosure and a circuit diagram illustrating part of the cell array of the non-volatile memory device.

In the fifth embodiment of this disclosure, a drain contact plug and a source contact plug coupled to one string are arranged on the same line, and strings S0 to S5 included in one string column are arranged in zigzags. In particular, strings configured to be adjacent to one another in a second direction II-II' and to share the same source line SL are coupled to different bit lines BL, and one string column is coupled to three bit lines BL0, BL1, and BL2. Here, each of the drain contact plugs adjacent to each other in the second direction II-II' are staggered from each other, and the source contact plugs adjacent to each other in the second direction II-II' are staggered from each other.

More specifically, the strings S0 and S1 sharing a source line SL0 are coupled to the respective bit lines BL1 and BL2, the strings S2 and S3 sharing a source line SL1 are coupled to the respective bit lines BL0 and BL2, and the strings S4 and S5 sharing a source line SL2 are coupled to the respective bit lines BL0 and BL1.

Here, three strings coupled to different bit lines BL, from among the strings S0 to S5 included in one string column, are controlled by a common drain select line C_DSL and a common source select line C_SSL. More specifically, the strings S0, S1, and S2 coupled to the respective bit lines BL2, BL1, and BL0 are controlled by a common drain select line C_DSL0 and a common source select line C_SSL0, and the strings S3, S4, and S5 coupled to the respective bit lines BL2, BL1, and BL0 are controlled by a common drain select line C_DSL1 and a common source select line C_SSL1.

Accordingly, when, for example, source-side word lines WL14 are activated, source-side memory cells belonging to the strings S0, S1, and S2 are driven as one page page_n, and source-side memory cells belonging to the strings S3, S4, and S5 are driven as one page page_n+1.

Figure 11A:
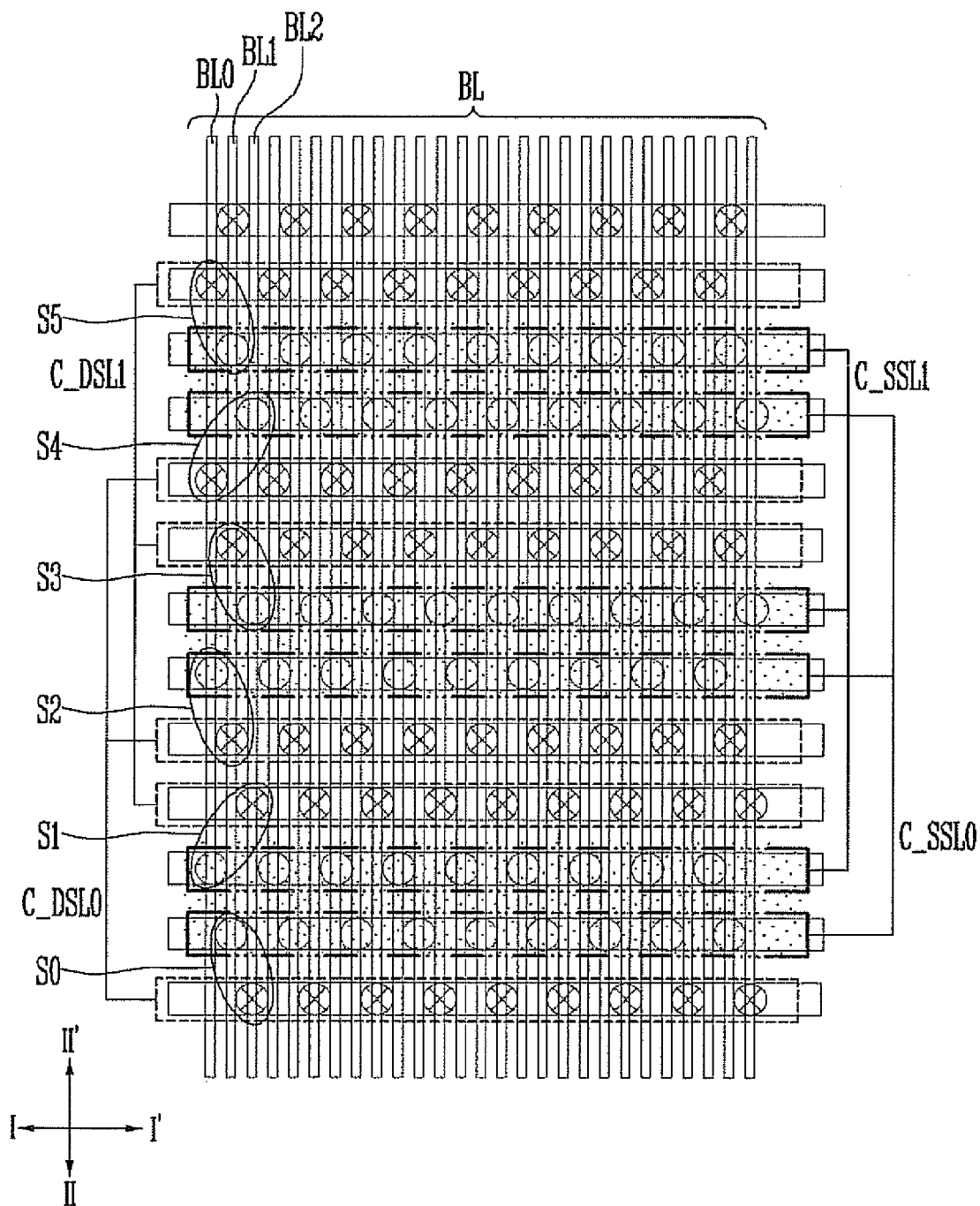
FIGS. 11A and 11B are a layout diagram of a non-volatile memory device having a 3-D structure according to a sixth embodiment of this disclosure and a circuit diagram illustrating part of the cell array of the non-volatile memory device.
Figure 11B:
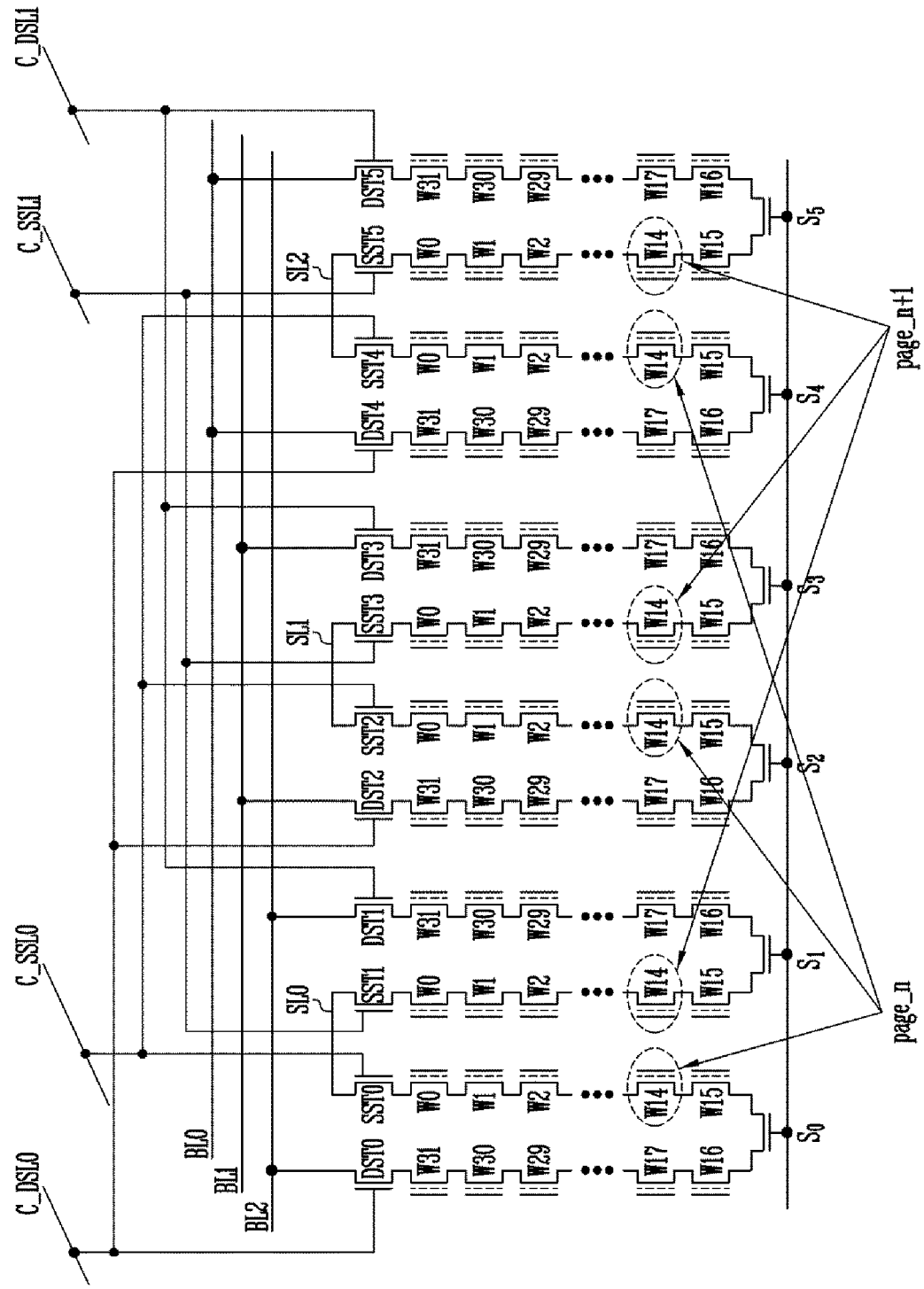

FIGS. 11A and 11B are a layout diagram of a non-volatile memory device having a 3-D structure according to a sixth embodiment of this disclosure and a circuit diagram illustrating part of the cell array of the non-volatile memory device.

In the sixth embodiment of this disclosure, a drain contact plug and a source contact plug coupled to one string are arranged in staggered form, and strings S0 to S5 included in one string column are arranged in zigzags. In particular, the drain contact plugs of strings configured to be adjacent to each other in the second direction II-II' and to share the same source line SL are coupled to the same bit line BL, and thus one string column is coupled to three bit lines BL0, BL1, and BL2. Here, each of the drain contact plugs adjacent to each other in the second direction II-II' are staggered from each other and the source contact plugs adjacent to each other in the second direction II-II' are staggered from each other.

More specifically, the drain contact plugs of strings S0 and S1 sharing a source line SL0 are coupled to the same bit lines BL2, the drain contact plugs of strings S2 and S3 sharing a source line SL1 are coupled to the same bit lines BL1, and drain contact plugs of the strings S4 and S5 sharing a source line SL2 are coupled to the same bit lines BL0. In addition, the source contact plugs of two adjacent strings are formed under different bit lines. For example, the source contact plug of string S0 is formed under bit line BL1, and the source contact plug of strong S1 is formed under bit line BL0.

Here, three strings coupled to different bit lines BL, from among the strings S0 to S5 included in one string column, are controlled by a common drain select line C_DSL and a common source select line C_SSL. More specifically, the strings S0, S2, and S4 coupled to different bit lines BL are controlled by a common drain select line C_DSL0 and a common source select line C_SSL0, and the strings S1, S3, and S5 coupled to different bit lines BL are controlled by a common drain select line C_DSL1 and a common source select line C_SSL1.

Accordingly, when, for example, source-side word lines WL14 are activated, source-side memory cells belonging to the strings S0, S2, and S4 are driven as one page page_n, source-side memory cells belonging to the strings S1, S3, and S5 are driven as one page page_n+1.

In accordance with this disclosure, an example in which one source-side word line structure or one drain-side word line structure is patterned in the second direction II-II' for every source-side word line structure or drain-side word line structure has been described, but this is only for illustration purposes. This disclosure is not limited to the example. For example, the etch process of etching a plurality of the interlayer dielectric layers and a plurality of the conductive layers between the adjacent strings to separate the plurality of source-side word lines S_WL and the plurality of drain-side word lines D_WL of the adjacent strings from each other (refer to FIG. 5) may be omitted.

In accordance with this disclosure, one string column is coupled to at least two bit lines, and two strings coupled to different bit lines, from among strings included in one string column, are controlled by the same common drain select line and the same common source select line. Accordingly, the number of pages necessary to drive the specific number of strings included in one memory block may be reduced as compared with conventional arts. More specifically, the number of memory cells driven as one page may be increased.

Accordingly, the semiconductor device of this disclosure may be implemented to have a standard package size, and the conventional controllers and applications may be used without change. Furthermore, since the number of pages included in one memory block is reduced, interference between memory cells may be reduced and the threshold voltages of programmed memory cells may be improved. In particular, the degree of integration of memory devices may be increased because string columns are arranged in zigzags so that channels are staggered from each other. Furthermore, the number of select transistors respectively operated within a memory block may be reduced by using the common drain select line and the common source select line. Accordingly, the width of the memory block may be reduced, and the size of an X-decoder may be reduced.

What is claimed is:

1. A non-volatile memory device having a three-dimensional (3-D) structure, comprising:
    a plurality of strings each including a drain select transistor, drain-side memory cells, a pipe transistor, source-side memory cells, and a source select transistor coupled in series, wherein the plurality of strings are arranged in a first direction and a second direction crossing the first direction, and the strings arranged in the second direction form each of string column;
    a plurality of bit lines extended in the second direction and coupled to the drain select transistors of the strings included in the each string column; and
    a plurality of source lines extended in the first direction and in common coupled to the source select transistors of strings adjacent to each other in the second direction,
    wherein strings included in one of the string columns are staggered in the first direction and each of the string columns are coupled to at least two of the bit lines.

2. The non-volatile memory device of claim 1, further comprising:
    a plurality of source-side word lines control respective source-side memory cells included in one string respectively, wherein the source-side memory cells included in different strings and arranged in an identical level are controlled by same source-side word line; and
    a plurality of drain-side word lines control drain-side memory cells included in the one string respectively, wherein the drain-side memory cells included in different strings and arranged in an identical level are controlled by same drain-side word line.

3. The non-volatile memory device of claim 1, further comprising:
    a plurality of common drain select lines configured to each control the drain select transistors of two strings coupled to different bit lines, from among the strings included in one string column; and
    a plurality of common source select lines configured to each control the source select transistors of two strings coupled to different bit lines, from among the strings included in one string column.

4. The non-volatile memory device of claim 3, wherein in a read operation, a selected common drain select line and a selected common source select line are activated, and unselected common drain select lines and unselected common source select lines are deactivated.

5. The non-volatile memory device of claim 3, wherein in a program operation, a selected common drain select line is deactivated, unselected common drain select lines are activated, and selected and unselected common source select lines are deactivated.

6. The non-volatile memory device of claim 3, wherein in a program operation or a read operation, the source-side memory cells and the drain-side memory cells included in one string are driven as respective pages, and strings connected to different bit lines and controlled by an identical common drain select line and an identical common source select line are driven as a single page.

7. The non-volatile memory device of claim 1, wherein odd-numbered strings and even-numbered strings included in one string column are coupled to different bit lines.

8. The non-volatile memory device of claim 1, wherein strings connected to same source lines are coupled to same bit line.

9. The non-volatile memory device of claim 1, wherein strings connected to same source line are coupled to different bit lines.

10. The non-volatile memory device of claim 1, wherein strings configured to be adjacent to each other in the second direction and to share one of the plurality of source lines, from among the strings included in one string column, are coupled to the same bit line, one string column is coupled to three of the plurality of bit lines, and source contact plugs of the sources select transistor are formed under two different bit lines.

* * * * *